(12) United States Patent
Reid

(10) Patent No.: US 8,341,491 B2
(45) Date of Patent: Dec. 25, 2012

(54) SYSTEM AND METHOD FOR PROVIDING DATA INTEGRITY IN A NON-VOLATILE MEMORY SYSTEM

(75) Inventor: Robert Alan Reid, Superior, CO (US)

(73) Assignee: Cadence Design Systems, Inc., San Jose, CA (US)

( * ) Notice: Subject to any disclaimer, the term of this patent is extended or adjusted under 35 U.S.C. 154(b) by 1317 days.

(21) Appl. No.: 11/778,433

(22) Filed: Jul. 16, 2007

(65) Prior Publication Data
US 2009/0024899 A1  Jan. 22, 2009

(51) Int. Cl.
*H03M 13/00*  (2006.01)
(52) U.S. Cl. .................... 714/758; 702/189
(58) Field of Classification Search .......... 714/758; 702/189
See application file for complete search history.

(56) References Cited

U.S. PATENT DOCUMENTS
5,748,652 A * 5/1998 Kim .................. 714/807

\* cited by examiner

Primary Examiner — Guy Lamarre
(74) Attorney, Agent, or Firm — Sawyer Law Group, P.C.

(57) ABSTRACT

An invention is provided for ensuring data integrity in a non-volatile memory system, including boot block data integrity during Power On Reset. The invention includes loading data into a buffer, such as a flash buffer, and generating an error detection code for the data utilizing a check code generator located in the memory controller. The error detection code is compared to a previously stored error detection code associated with the data. Then, when the error detection code is different from the previously stored error detection code, a correction pattern is calculated and applied to the data directly in the buffer for the non-volatile memory.

15 Claims, 6 Drawing Sheets

SYSTEM AND METHOD FOR PROVIDING DATA INTEGRITY IN A NON-VOLATILE MEMORY SYSTEM

BACKGROUND OF THE INVENTION

1. Field of the Invention

This invention relates generally to non-volatile memory, and more particularly to a non-volatile memory controller capable of providing data integrity, including boot block data integrity, in a non-volatile memory system.

2. Description of the Related Art

Non-volatile memory is memory that retains stored data when not powered. Examples of non-volatile memory include Phase-change memory (PCM), Ferroelectric random access memory (FRAM), and flash memories. Because non-volatile memory retains stored data even when power to the memory is turned off, non-volatile memory is widely used in battery-driven portable devices. For example, flash memory often is utilized in digital audio players, digital cameras, mobile phones, and USB flash drives, which are used for general storage and transfer of data between computers.

Flash devices are designed to utilize two different types of technology, NOR technology and NAND technology. NOR flash devices have long erase and write times, but have an input/output (I/O) interface that allows random access to any location in the memory. As a result, NOR flash devices often are used for storing executable code, where the data that is stored is accessed in words or single instruction elements. Typically these accesses are to random locations because code execution often is non-sequential. This ability to fetch instructions from a flash device often is called "Execute in Place" (XIP).

NAND flash devices have faster erase/write times, higher density, and a lower cost per bit than NOR flash. However NAND flash devices have an I/O interface that allows only sequential access to data. As a result, NAND flash devices typically are used for storing data that is accessed in fixed sized pages. Typically these accesses are for a complete page of data. Although the read access time for a page is relatively slow for the first byte, the read access time for subsequent sequential bytes in the same page is extremely fast. Because of the inexpensive nature of the memory, NAND flash devices generally implement error correction code (ECC) functionality for block data integrity.

FIG. 1 is a diagram showing a prior art NAND flash memory based system 100 utilizing a NAND flash memory. The system 100 includes a processor 102, executing error correction software 104, and coupled to system memory 106. Also coupled to the processor 102 is a flash controller 108, which is coupled to flash memory 110. The flash controller 108 includes a plurality of registers 112 and a check code generator 114. The flash memory 110 includes a flash array 116 and a flash buffer 118.

In operation, the processor 102 utilizes the flash controller 108 to read and write data to the flash memory 110. For example, when writing data to the flash memory 110, the data is transferred from the system memory 106, though the flash controller 108, and into the flash buffer 118. When passing through the flash controller 108, the data passes through the check code generator 114, which calculates an error detection code that is appended to the data and stored with the data in the flash buffer 118. The data is then transferred from the flash buffer 118 and stored into the flash array 116.

When the data is later read from the flash memory 110, the flash controller 108 checks the data for errors using the check code generator 114. More particularly, when reading data from the flash memory 110, the data is transferred from the flash array 116 to the flash buffer 118. The flash controller 108 then reads the data from the flash buffer 118, passes the data through the check code generator 114, and stores the data into the system memory 106. While the data is being passed through the check code generator 114, the check code generator 114 calculates a new error detection code, which is compared to the error detection code that was stored with the data. If the new error detection code matches the stored error detection code, the data is error free. However, if the two error detection codes do not match, the error correction software 104 executing on the processor 102 attempts to correct the defects in the data, which is now stored in the system memory 106. This methodology works fine while the error correction software 104 is executing on the processor 102. However, the method does not perform properly when the error correction software 104 is not executing on the processor 102, such as at Power On Reset.

To address this issue, NAND flash memory vendors typically guarantee that the first page of data in the flash array 116 is free of defects. This eliminates the need for any ECC logic on the first page of data stored in the flash array 116. As a result, boot block data stored in the first page of data in the flash array 116 and used by the processor 102 during Power On Rest can be read into the processor 102 without first being checked for defects, as illustrated in FIG. 2.

FIG. 2 is a diagram showing the prior art NAND flash memory based system 100 during Power On Reset. Similar to above, the NAND flash memory based system 100 includes a processor 102 coupled to system memory 106 and a flash controller 108, which is coupled to flash memory 110. The flash controller 108 includes a plurality of registers 112 and a check code generator 114. The flash memory 110 includes a flash array 116 and a flash buffer 118.

During Power On Reset, boot block data must be loaded into the flash buffer 118 before any other software can execute on the processor 102. Thus, during Power On Reset the processor 102 is not executing error correction software. Consequently, error correction cannot occur prior to loading the boot block data. Fortunately, the boot block data is free of errors because it is stored in the first page of the flash array 116, which is guaranteed to be defect free. As a result, the processor 102 can execute the boot block data directly from the page buffer 118 without being first checked for errors.

As demand for greater functionality in devices has increased, so has demand for flash memory with greater storage capacity. To address such demands, multilevel-cell (MLC) flash memory has been developed. Single Level Cell (SLC) memory, as used in the prior flash devices described with reference to FIGS. 1 and 2, contain one bit of data in each memory cell. MLC memory cells contain two or more bits of data, thereby increasing the storage capacity of the device.

However, MLC flash memory is much less reliable than SLC flash memory. As such, MLC flash memory vendors no longer guarantee that the first page of data in the flash array will be free of defects. Consequently, the boot block data stored in the flash array is no longer guaranteed to be defect free, and thus cannot be safely read directly to the processor during Power On Reset without first being checked for errors.

In view of the foregoing, there is a need for systems and methods for checking the data integrity of boot block data from a flash memory device during Power On Reset. Because error correction logic is not running on the processor during Power On Reset, the systems and methods should not rely on system processor based error correction during Power On Reset.

SUMMARY OF THE INVENTION

Broadly speaking, embodiments of the present invention address these needs by providing data integrity in a non-volatile memory system using a memory controller that is capable of correcting data errors within the buffer associated with the non-volatile memory, such as a flash buffer in a flash memory system. In one embodiment, a method for providing data integrity in a non-volatile memory system is disclosed. The method includes loading data into a buffer and generating an error detection code for the data utilizing a check code generator located in the memory controller. The error detection code is compared to a previously stored error detection code associated with the data. Then, when the error detection code is different from the previously stored error detection code, a correction pattern is calculated and applied to the data directly in the buffer. Thus, when the data is boot block data in a flash memory system, the system can safely boot using the flash memory. Optionally, when unable to calculate a correction pattern, the flash buffer can be re-loaded with boot block data from an alternate boot block storage location. Generally, the system processor can be allowed access to the boot block data when no errors are present in the boot block data stored in the flash buffer.

In a further embodiment of the present invention, a non-volatile memory controller capable of checking data integrity is disclosed. The non-volatile memory controller includes a check code generator that generates error detection codes for data stored in a buffer, such as a flash buffer. In addition, the non-volatile memory controller includes error correction logic that calculates a correction pattern and offset for detected errors within the data. Similar to above, the non-volatile memory controller applies the correction pattern at the calculated offset to the data stored in the buffer when errors are present. To determine if an error exists in the data, the non-volatile memory controller compares a generated error detection code associated with the data to a previously stored error detection code associated with the data. In doing this, the memory controller provides a copy of the data stored in the buffer to the check code generator and discards the copy after the check code generator generates the error correction code for the data, thus avoiding the need for extra storage in the memory controller. If the system processor is unable to execute instructions directly from the buffer, the memory controller can optionally transfer the data to system memory when no errors are present in the data. Thereafter, the system processor can fetch program instructions non-sequentially from the system memory.

In an additional embodiment, a non-volatile memory device capable of checking data integrity is disclosed. The non-volatile memory device includes a non-volatile memory, which includes a memory array coupled to a buffer. In addition, the non-volatile memory device includes a non-volatile memory controller that is coupled to the non-volatile memory. Similar to above, the memory controller includes a check code generator that generates error detection codes for data stored in the buffer. The memory controller also includes error correction logic that calculates a correction pattern and offset for detected errors within the data. As above, the memory controller applies the correction pattern at the calculated offset to data in the buffer when errors are detected in the data. To detect errors, the memory controller compares a generated error detection code associated with the data to a previously stored error detection code associated with the data. The memory controller then provides the system processor access to the data when no errors are present in the data stored in the buffer. Thus, when the data is boot block data the system can safely boot using the flash memory.

In a further embodiment, a method for providing data integrity in a non-volatile memory system is disclosed wherein the error detection and correction are the same. In this embodiment, the method includes loading data into a buffer associated with non-volatile memory, such as a flash buffer in a flash system. An error correction pattern is generated for the data utilizing error correction logic located in a non-volatile memory controller, such as a flash controller. Then, the correction pattern is applied to the data in the buffer. When the data includes errors, the correction pattern corrects the errors in the data. However, in this embodiment, the error correction pattern does not alter the data in the buffer when errors are not present in the data. Thus, the correction pattern does not alter the data when the data is error free.

A further method for providing data integrity in a non-volatile memory system in an additional embodiment of the present invention. The method includes loading data into a buffer associated with non-volatile memory. Here, the data is encoded in an error-tolerant coding. Then, data is extracted from the error-tolerant coding utilizing an extractor located in a memory controller.

Thus, embodiments of the present invention can advantageously be utilized to ensure the processor has access to error free boot block data during Power On Reset. Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

An invention is disclosed for providing boot block data integrity in a non-volatile memory system. Broadly speaking, embodiments of the present invention provide error correction logic in a memory controller. During Power On Rest the memory controller reads boot block data from the flash buffer, passes it through a check code generator, and discards the read data. While the data is being read through the check code generator, the check code generator generates a new error detection code for the data. If the data is determined to be valid, the boot block data is provided directly to the processor. Otherwise the error correction logic in the flash controller attempts to correct the data defects while the boot block data is still stored in the flash buffer. Once corrected, the boot block data is provided to the processor to complete the boot process. Although the embodiments of the present invention will be described primarily in terms of boot block data integrity, it should be noted that the embodiments of the present invention can be utilized to insure data integrity for any data stored in the non-volatile memory. Moreover, it should be noted that the embodiments of the present invention can be utilized with many forms of non-volatile memory in addition to flash memories, such as PCM, FRAM, and other non-volatile memories.

In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

Figure 1:
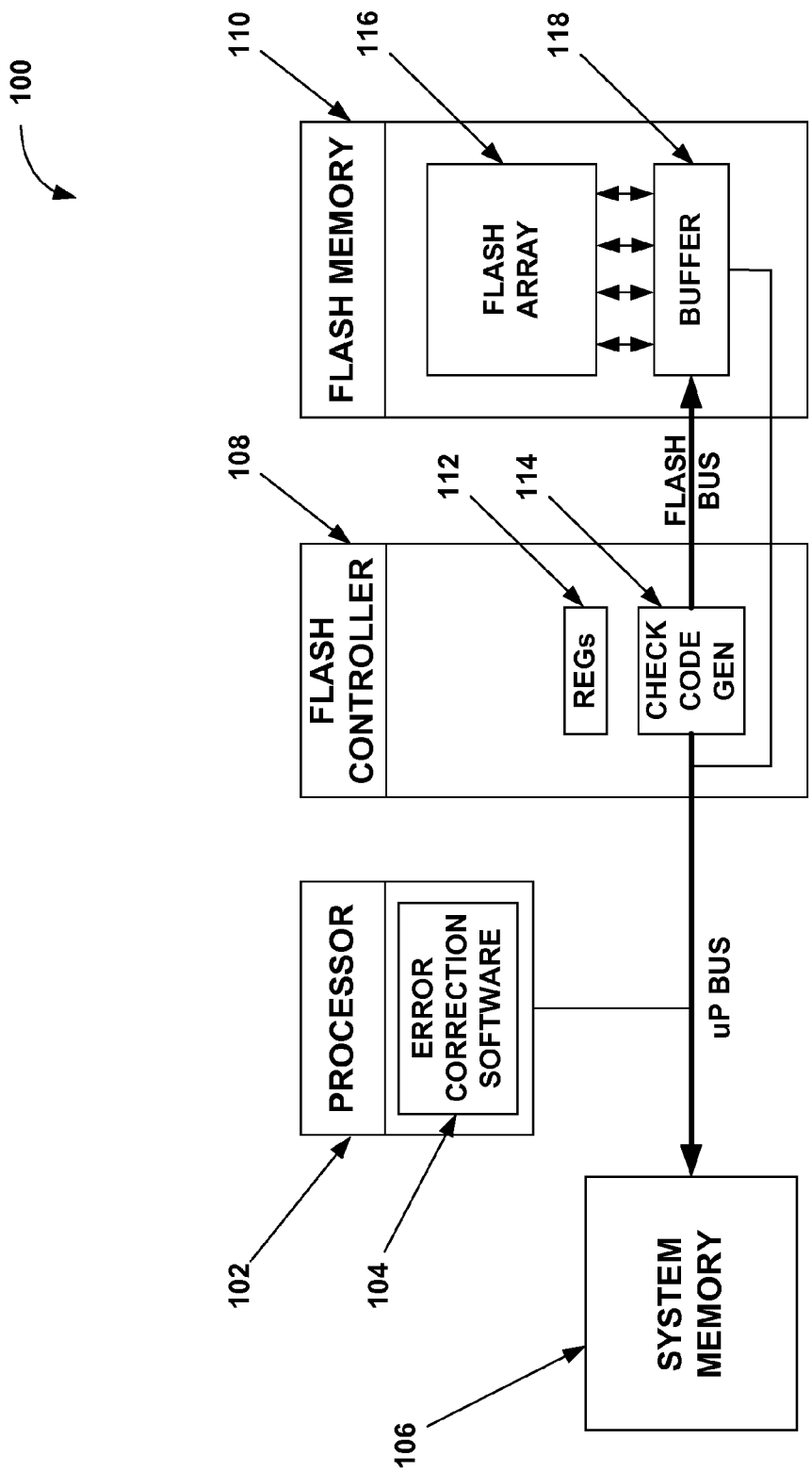
FIG. 1 is a diagram showing a prior art NAND flash memory based system utilizing a NAND flash memory system.
Figure 2:
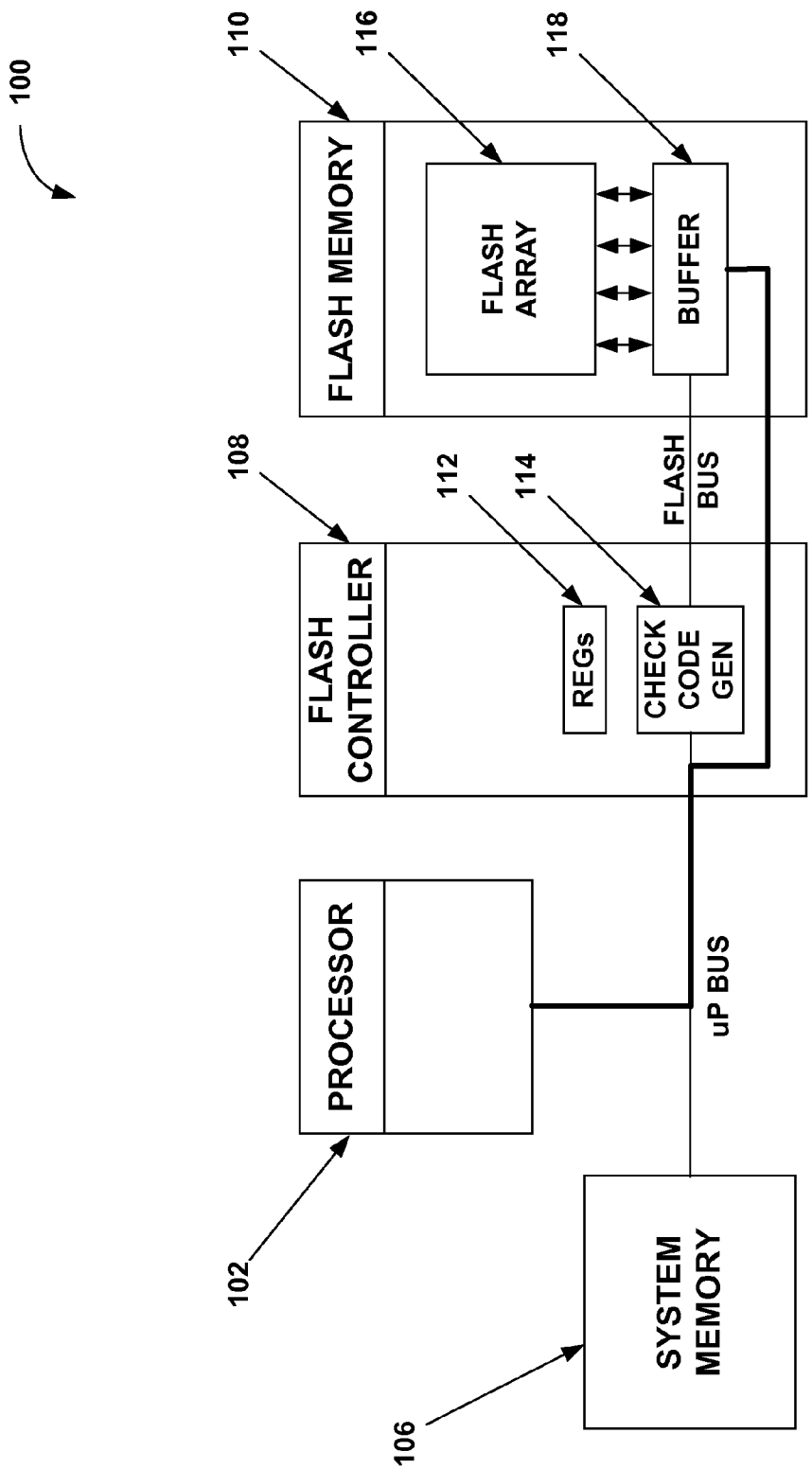
FIG. 2 is a diagram showing the prior art NAND flash memory based system during Power On Reset.
Figure 3:
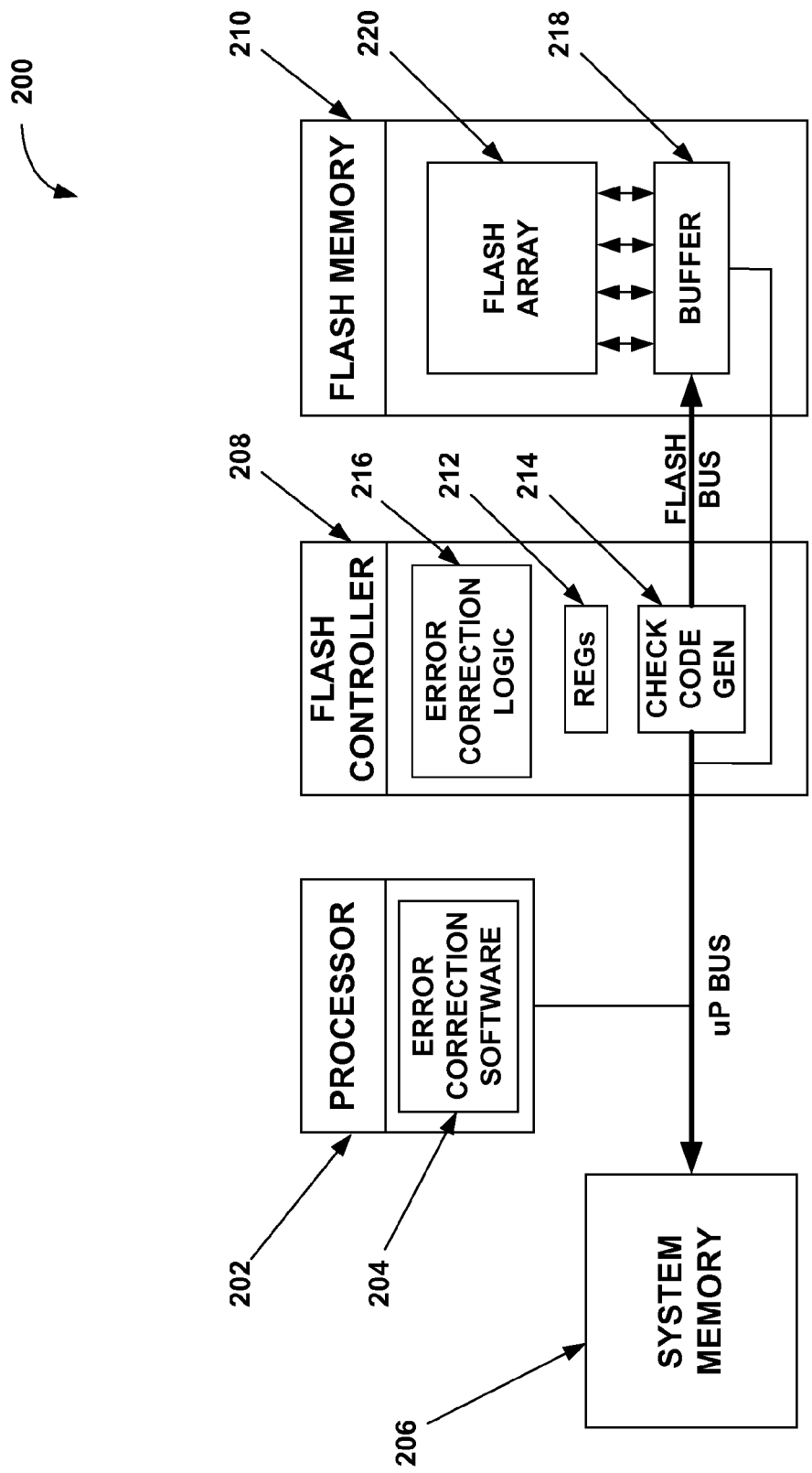
FIG. 3 is a diagram showing a device using a non-volatile memory system capable of booting from non-volatile memory when defects may be present in the boot block, such as in MLC flash memory, in accordance with an embodiment of the present invention.

FIGS. 1 and 2 were described in terms of the prior art. FIG. 3 is a diagram showing a device 200 using a non-volatile memory system capable of booting from non-volatile memory when defects may be present in the boot block, such as in MLC flash memory, in accordance with an embodiment of the present invention. In the example of FIG. 3, the non-volatile memory system is a NAND flash memory system, however, it should be noted that the embodiments of the present invention can be utilized many other types of non-volatile memory as will be apparent to those skilled in the art after a careful reading of the present disclosure. The device 200 includes a processor 202, executing error correction software 204, coupled to system memory 206. Also coupled to the processor 202 is a flash controller 208, which is coupled to flash memory 210. The flash controller 208 includes a plurality of registers 212, a check code generator 214, and error correction logic 216. The flash memory 210 includes a flash buffer 218 and a flash array 220.

During normal operation, the processor 202 utilizes the flash controller 208 to read and write data to the flash memory 210. When writing data to the flash memory 210 during normal operation, the data is transferred from the system memory 206, though the flash controller 208, and into the flash buffer 218. When passing through the flash controller 208, the data passes through the check code generator 214, which calculates a code (often called an error detection code) that is appended to the data and stored along with the data in the flash buffer 218. The data is then transferred from the flash buffer 218 and stored into the flash array 220.

When the data is later read from the flash memory 210 during normal operation, the flash controller 208 checks the data for errors using the check code generator 214. Similar to above, when reading data from the flash memory 210, the data is transferred from the flash array 220 to the flash buffer 218. The flash controller 208 then reads the data from the flash buffer 218, passes the data through the check code generator 214, and stores the data into the system memory 206.

While the data is being passed through the check code generator 214, the check code generator 214 calculates a new error detection code, which is compared to the error detection code that was stored with the data. If the new error detection code matches the stored error detection code, the data is error free. However, if the two error detection codes do not match, the error correction software 204 executing on the processor 202 attempts to correct the defects in the data, which is now stored in the system memory 206.

However, there are instances where the SLC or MLC flash memory cannot be guaranteed to be free of errors. For example, as mentioned above, MLC flash memory has been developed to address the demand for flash memory with greater storage capacity. However, because the MLC flash memory is much less reliable than SLC flash memory, MLC flash memory vendors no longer guarantee that the first page of data in the flash array will be free of defects. Consequently, the boot block data stored in the flash array is no longer guaranteed to be defect free, and thus cannot be safely read directly to the processor 202 during Power On Reset without first being checked for errors. To address these issues embodiments of the present invention provide boot block data integrity using the flash controller 208, as described next with reference to FIG. 4.

Figure 4:
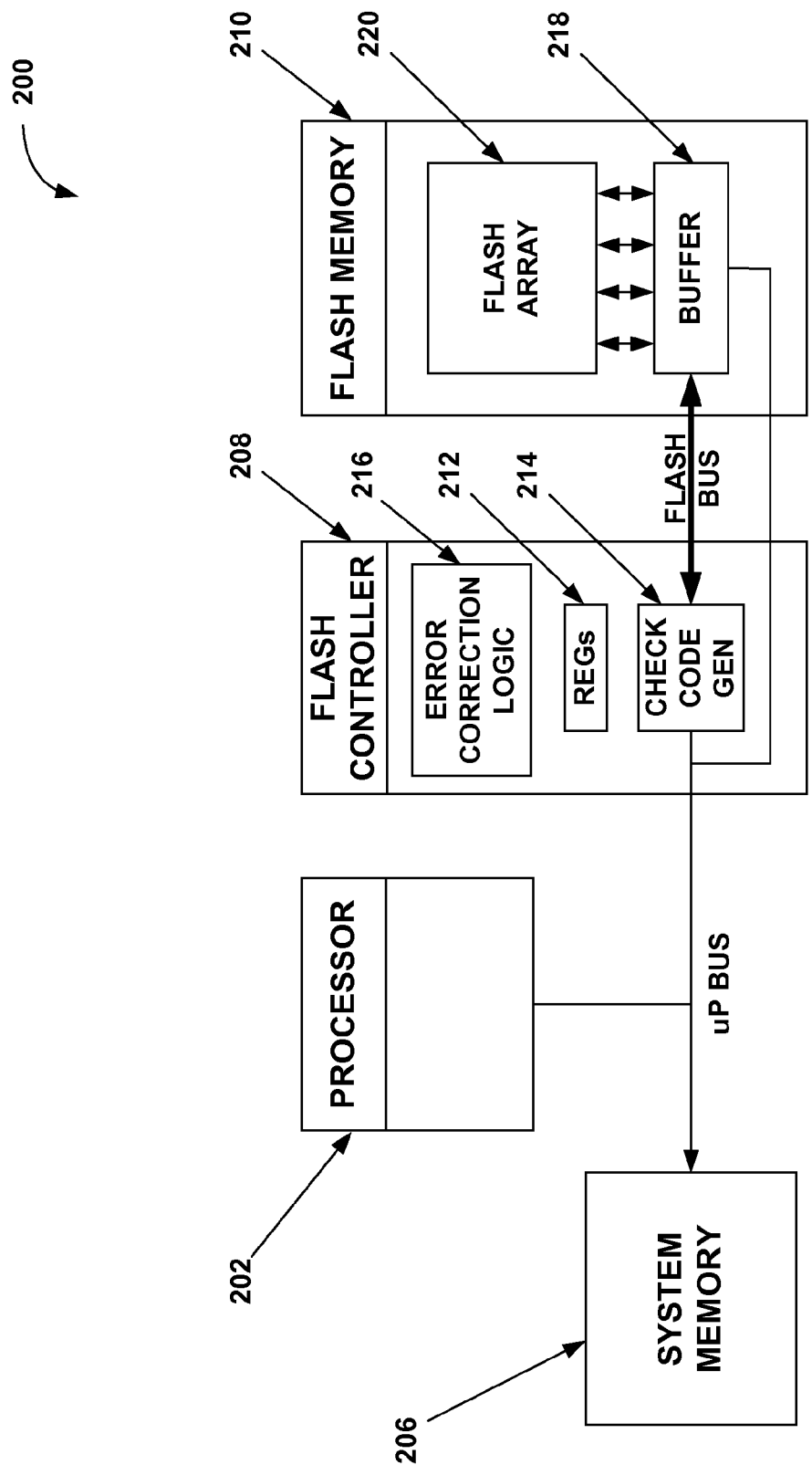
FIG. 4 is a diagram showing the device using a NAND flash non-volatile memory system during Power On Reset, in accordance with an embodiment of the present invention.

FIG. 4 is a diagram showing the device 200 using a NAND flash non-volatile memory system during Power On Reset, in accordance with an embodiment of the present invention. As described above, the device 200 includes a processor 202 coupled to system memory 206 and to flash controller 208, which is coupled to flash memory 210. The flash controller 208 includes a plurality of registers 212, a check code generator 214, and error correction logic 216. The flash memory 210 includes a flash buffer 218 and a flash array 220. As mentioned previously, boot block data is stored in the flash array 220 for use by the processor 202 during Power On Reset.

During Power On Reset, boot block data must be loaded into the processor 202 before any other software can execute on the processor 202. Thus, during Power On Reset the processor 202 is not executing error correction software. However, embodiments of the present invention provide error correction functionality during Power On Reset by including error correction logic 216 in the flash memory controller 208. The error correction logic 216 can advantageously be utilized to ensure error free boot block data is provided to the processor 202 during Power On Reset. As with all data stored in the flash array 220, an error detection code corresponding to the boot block data is stored along with the boot block data in the flash array 220.

More specifically, when power is first provided to the system, the device is in a state called reset. While in the reset state the hardware of the device 200 is setup and stabilized. During this time, the flash controller 208 loads the boot block data from the flash array 220, generally stored at page zero, into the flash buffer 218. However, as mentioned above, the boot block data loaded into the flash buffer 218 may contain errors. Thus, the boot block data should be checked for errors, and any errors found corrected, prior to providing the boot block data to the processor 202.

To do this, the flash controller 208 provides the boot block data from the flash buffer 218 to the check code generator 214. It should be noted that although the boot block data is provided to the check code generator 214, the flash buffer 218 continues to include a copy of the boot block data. The check code generator 214 calculates a new error detection code for the boot block data. However, instead of gating the boot block to the flash controller's system bus logic, the boot block data provided to the check code generator 214 is discarded. Since the boot block data provided to the check code generator 214 is discarded, there is no requirement for additional storage within the flash controller 208, nor are additional cycles required for storing the data in system memory prior to data correction.

The new error detection code for the boot block data then is compared to the error detection code that was stored with the boot block data. If the new error detection code matches the stored error detection code, the data is error free. However, if the two error detection codes do not match, the error correction logic 216 attempts to correct the defects in the boot block data. More specifically, if the two error detection codes do not match the flash controller 208 attempts to use the error correction logic 216 to calculate a correction pattern and offset to the error and then apply to correction to the defective boot block data stored in the flash buffer 218. Generally, a correction pattern is a bit pattern that when applied at the calculated offset corrects the error or errors in the defective data. If unable to calculate a correction pattern and offset that will correct the error, the flash controller 208 re-loads the flash buffer 218 from an alternate boot block storage location and repeats the process. Once the data is error free, it is provided to the processor 202, as illustrated next with reference to FIG. 5.

Figure 5:
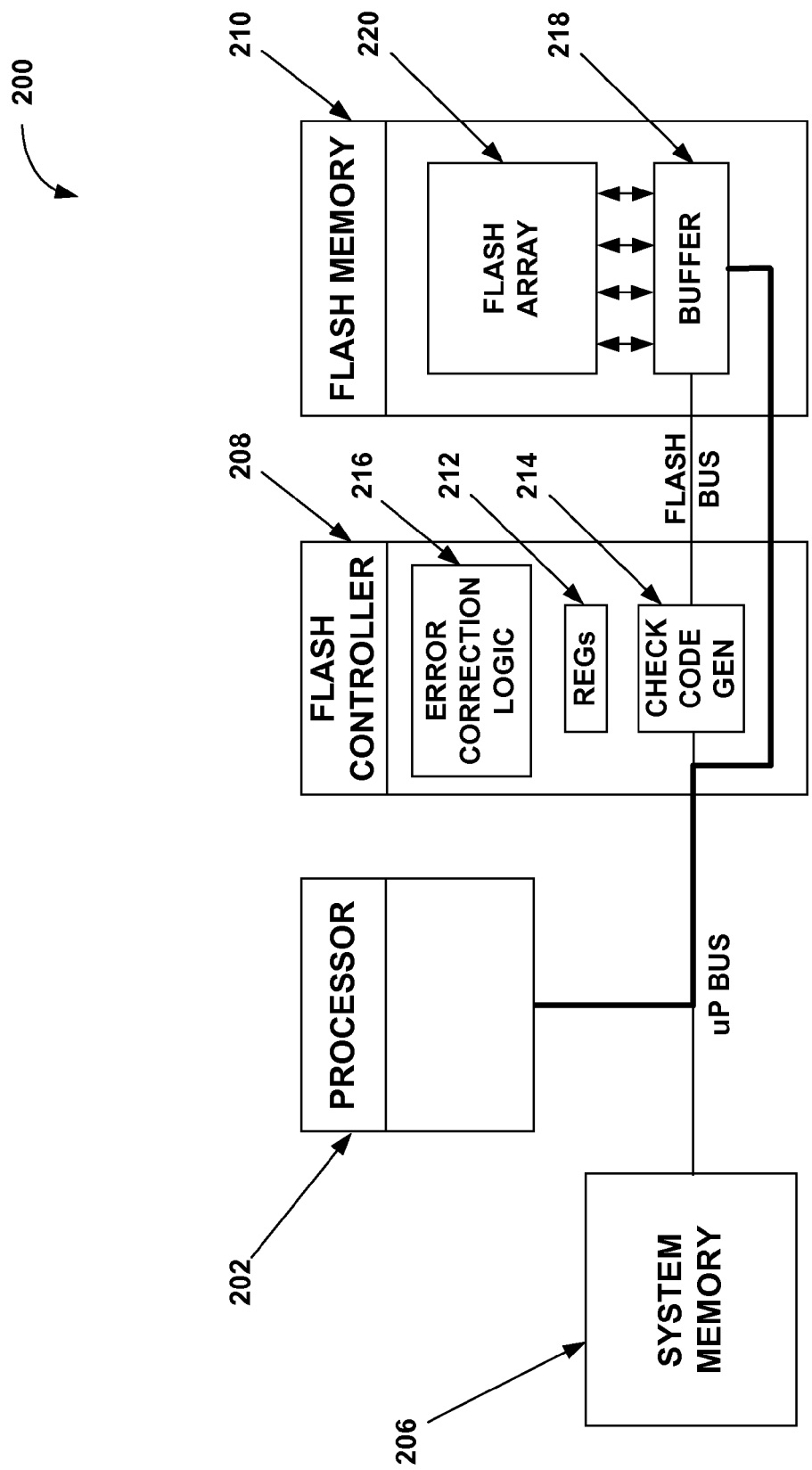
FIG. 5 a diagram showing the device using a NAND flash memory system during Power On Reset after the boot block data stored in the flash buffer is free of errors, in accordance with an embodiment of the present invention.

FIG. 5 a diagram showing the device 200 using a NAND flash memory system during Power On Reset after the boot block data stored in the flash buffer 218 is error free, in accordance with an embodiment of the present invention. As above, the device 200 includes a processor 202 coupled to system memory 206 and to flash controller 208, which is coupled to flash memory 210. The flash controller 208 includes a plurality of registers 212, a check code generator 214, and error correction logic 216. The flash memory 210 includes a flash buffer 218 and a flash array 220.

After testing the boot block data stored in the flash buffer 218 for errors, and correcting any found errors, the boot block data stored in the flash buffer 218 is ready to be utilized by the processor 202. In one embodiment, the processor 202 is capable of fetching program instructions non-sequentially directly from the flash buffer 218. This ability to fetch instructions from a flash device often is called "Execute in Place" (hereinafter "XIP"). In this embodiment, the boot block data is provided directly to the processor 202, bypassing the check code generator 214. However, if the processor 202 is not capable of XIP, the boot block data can be provided to system memory 206 instead, again bypassing the check code generator 214. In this case, the processor 202 can execute the boot block data from system memory 206.

Figure 6:
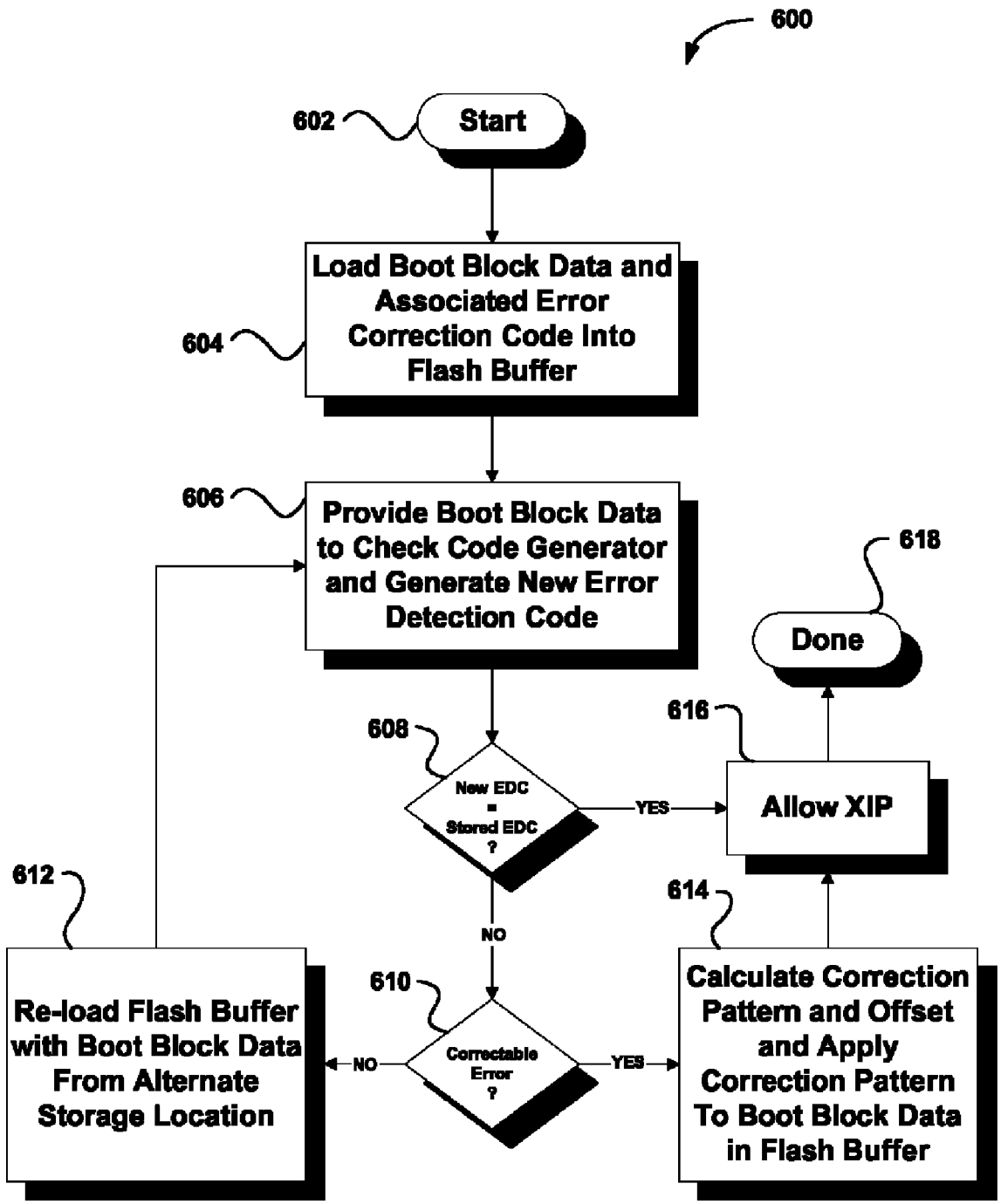
FIG. 6 is a flowchart showing a method for providing data integrity in a non-volatile memory system, in accordance with an embodiment of the present invention.

FIG. 6 is a flowchart showing a method 600 for providing data integrity in a non-volatile memory system, in accordance with an embodiment of the present invention. Although the method 600 will be described in terms of flash memory, it should be noted that the embodiments of the present invention can be utilized with many other types of non-volatile memory, such as PCM, FRAM, and other non-volatile memories as will be apparent to those skilled in the art after a careful reading of the present disclosure.

In an initial operation 602, preprocess operations are performed. Preprocess operations can include, for example, storing boot block data into flash memory, generating an associated error detection code for the boot block data, storing the associated error detection code in flash memory, and other preprocess operations that will be apparent to those skilled in the art after a careful reading of the present disclosure.

In operation 604, boot block data and the associated error detection code is loaded into the flash buffer. When power is first provided to the system, the flash controller loads the boot block data from the flash array, generally stored at page zero, into the flash buffer. However, as mentioned above, the boot block data loaded into the flash buffer may contain errors. Thus, the boot block data is checked for errors prior to being provided to the processor, as illustrated next in operation 606.

In operation 606, the boot block data is provided to the check code generator and a new error detection code is generated. In particular, the flash controller provides the boot block data to the check code generator from the flash buffer. As noted above, the flash buffer maintains a copy of the boot block data during this operation. The check code generator calculates a new error detection code for the boot block data. However, instead of gating the boot block to the flash controller's system bus logic, the boot block data provided to the check code generator is discarded. Discarding the data eliminates the requirement for additional storage within the flash controller, and saves cycles by not requiring cycles for storing the data in system memory prior to data correction.

The newly generated error detection code then is compared to the stored error detection code associated with the boot block data, in operation 608. Similar to normal operation, during Power On Reset the flash controller uses the check code generator to determine if errors are present in the boot block data. If the newly generated error detection code is the same as the stored error detection code associated with the boot block data, the boot block data is error free and the method 600 branches to operation 616. However, if the newly generated error detection code differs from the stored error detection code associated with the boot block data, the boot block data contains errors and the method 600 continues to operation 610.

In operation 610, a decision is made as to whether the detected error in the boot block data is correctable. If the detected error in the boot block data is correctable the method 600 branches to error correction operation 614. Otherwise, the method 600 branches to re-load operation 612.

In a re-load operation 612, the flash controller re-loads the flash buffer with the boot block data from an alternate boot block storage location. Occasionally, detected errors are uncorrectable, because of too many errors in the data or some other cause. To address these cases, additional boot block data can be stored in an alternate location within the flash array. In this manner, if the primary boot block data storage location with the flash array is corrupted, the alternate boot block data can be utilized to boot the device. Once the flash buffer is re-loaded with boot block data from the alternate boot block storage location, the method 600 continues by checking the re-loaded data in another data check operation 606.

In operation 614, a correction pattern and offset to the error in the boot block data is calculated and applied to the boot block data stored in the flash buffer. In particular, if the two error detection codes do not match, the flash controller attempts to use its error correction logic to calculate a correction pattern and offset to the error in the boot block data. Since the boot block data is stilled stored in the flash buffer, the calculated correction is applied directly to the defective boot block data stored in the flash buffer. Advantageously, use of the flash buffer for error correction eliminates any requirement for a flash buffer in the flash controller itself to store the boot block data during error correction. An extra flash buffer built into the flash controller would require additional silicon and dramatically increase manufacturing costs.

In operation 616, the boot block data is provided to the processor. After testing the boot block data stored in the flash buffer, and correcting any found errors, the boot block data stored in the flash buffer is ready to be utilized by the processor. If the processor is XIP capable, that is, capable of fetching program instructions non-sequentially directly from the flash buffer, the boot block data is provided directly to the processor, bypassing the check code generator. However, if the processor is not XIP capable, the boot block data can be provided to system memory instead, again bypassing the check code generator. In this case, the processor can execute the boot block data from system memory.

Post process operations are performed in operation 618. Post process operations can include, for example, executing the boot block data, further system setup, and other post process operations that will be apparent to those skilled in the art after a careful reading of the present disclosure. In this manner, embodiments of the present invention provide boot block integrity in a flash memory system even when the first page of data in the flash array is not guaranteed to be error free, such as when utilizing MLC memory cells in the flash memory. Further, by utilizing the flash buffer for error correction, there is no requirement for additional storage within the flash controller, nor are additional cycles required for storing the data in system memory prior to data correction.

It should be noted that the error detection and correction operations can be the same. That is, after loading data into the flash buffer, an error correction pattern can be generated for the data utilizing the error correction logic located in the memory controller. The correction pattern can then be applied to the data in the flash buffer. When the data includes errors, the correction pattern corrects the errors in the data. However, in this embodiment, the error correction pattern does not alter the data in the buffer when errors are not present in the data. Thus, the correction pattern does not alter the data when the data is error free. In a further embodiment, error-tolerant coding can be used to store data. In this embodiment, after loading data into the flash buffer, data is extracted from the error-tolerant coding utilizing an extractor located in a memory controller.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for providing boot block data integrity in a non-volatile memory system, comprising the operations of:
   loading boot block data into a buffer;
   generating an error detection code for the boot block data utilizing a check code generator located in a memory controller;
   comparing the error detection code to a previously stored error detection code associated with the boot block data; and
   calculating a correction pattern and applying the correction pattern to the boot block data in the buffer when the error detection code is different from the previously stored error detection code.

2. The method of claim 1, wherein the buffer is a flash buffer in a flash memory device.

3. The method of claim 1, further comprising the operation of the re-loading the buffer with boot block data from an alternate boot block storage location when unable to calculate a correction pattern.

4. The method of claim 1, wherein a processor is allowed to fetch program instructions non-sequentially from the boot block data stored in the buffer.

5. The method of claim 1, wherein error correction logic located within the memory controller is utilized to calculate the correction pattern.

6. The method of claim 1, further comprising the operation of providing a copy of the boot block data stored in the buffer to the check code generator and discarding the copy of the boot block data after generating the error detection code.

7. The method of claim 1, wherein the correction pattern corrects errors in the boot block data when the boot block data includes errors.

8. The method of claim 1, wherein the correction pattern does not alter the boot block data when the boot block data is error free.

9. The method of claim 1, wherein the boot block data is encoded in an error-tolerant coding.

10. A non-volatile memory device capable of checking boot block data integrity, comprising:
    a non-volatile memory including a memory array coupled to a buffer; and
    a non-volatile memory controller coupled to the non-volatile memory, the non-volatile memory controller including a check code generator that generates error detection codes for boot block data stored in the buffer, the non-volatile memory further including error correction logic that calculates a correction pattern and offset for detected errors within the boot block data,
    wherein the non-volatile memory controller applies the correction pattern at the calculated offset to boot block data in the buffer when boot block data errors are detected.

11. The non-volatile memory device of claim 10, wherein the non-volatile memory controller compares a generated error detection code associated with the boot block data to a previously stored error detection code associated with the boot block data to determine if an error exists in the boot block data.

12. The non-volatile memory device of claim 11, wherein the non-volatile memory controller provides a copy of the boot block data stored in the buffer to the check code generator and discards the copy of the boot block data after the check code generator produces the generated error detection code for the boot block data.

13. The non-volatile memory device of claim 10, wherein the buffer is a flash buffer in a flash memory device.

14. The non-volatile memory device of claim 13, wherein the non-volatile memory controller provides a processor access to the boot block data when no errors are detected in the boot block data stored in the flash buffer.

15. The non-volatile memory device of claim 14, wherein the processor is allowed to fetch program instructions non-sequentially from the boot block data stored in the flash buffer bypassing the check code generator.

* * * * *